United States Patent [19]

Suzuki et al.

[11] 4,101,411

[45] Jul. 18, 1978

[54] PLASMA ETCHING APPARATUS

[75] Inventors: Keizo Suzuki; Sadayuki Okudaira, both of Kokubunji; Ichiro Kanomata, Fuchu; Noriyuki Sakudo, Ohme, all of Japan

[73] Assignee: Hitachi, Ltd., Japan

[21] Appl. No.: 787,878

[22] Filed: Apr. 15, 1977

[30] Foreign Application Priority Data

Apr. 15, 1976 [JP] Japan ............................ 51-42787
Apr. 15, 1976 [JP] Japan ............................ 51-42788

[51] Int. Cl.$^2$ .................... C23C 15/00; B01K 1/00
[52] U.S. Cl. ...................... 204/298; 219/121 P; 250/531
[58] Field of Search ............ 204/164, 192 E, 192 EC, 204/298; 219/121 P; 250/531; 156/643

[56] References Cited

U.S. PATENT DOCUMENTS 3,879,597  4/1975  Bersin et al. .................... 219/121 P

*Primary Examiner*—Aaron Weisstuch
*Attorney, Agent, or Firm*—Craig & Antonelli

[57] ABSTRACT

In an apparatus wherein a microwave discharge is caused by introducing a discharge gas into a discharge area to which a microwave electric field is supplied by a microwave coupler and to which an external magnetic field is supplied by a magnetic field generator, whereby the surface of a substrate is etched by using ions in a generated plasma, a plasma etching apparatus is characterized by employing a round waveguide as the microwave coupler, the discharge area being formed within the round waveguide.

7 Claims, 5 Drawing Figures

PLASMA ETCHING APPARATUS

BACKGROUND OF THE INVENTION

This invention relates to a processing apparatus for treating a solid surface using ions and, more particularly, to an apparatus for etching a solid surface by the use of ions, radical atoms and/or radical molecules in a plasma.

Recently, dry etching with employs an ion beam or ions, radical atoms and radical molecules in a plasma has been increasingly utilized in technical fields, such as the field of semiconductors, which require a very fine etching technique of several microns or less. As compared with the former method employing an ion beam, the latter method employing ions in a plasma has a higher ion density and has the merit of a higher etching rate, so that various studies have been made thereon. Among them, an expedient in which the plasma is generated by a microwave discharge is especially advantageous for several reasons, e.g. (1) since a discharge gas can break down even under a low pressure [below $1 \times 10^{-3}$ Torr], the directions of ions become regular, (2) a plasma of especially high density can be generated, and (3) owing to an electrodeless discharge, the life of the apparatus is long, a chemical-active gas being usable. The details of this expedient are described in Japanese patent laid open specification No. 51-71597.

FIG. 1 shows the construction of a prior-art etching apparatus exploiting the microwave discharge. Microwaves produced by a microwave generator 1 are radiated into a rectangular waveguide 2. At a position of about $\frac{1}{4}$ of a guide wavelength ($\lambda_g$) from the terminal end of the rectangular waveguide 2, one end of an inner conductor 4 of a coaxial waveguide 3 protrudes into the waveguide 2, as shown in the figure. Through an antenna thus constructed, microwaves are propagated from the waveguide 2 to the coaxial waveguide 3. Further, an electric field of microwaves is propagated into a discharge area 5 through an insulator 7 as well as a device 6 for the coupling between the microwaves and the plasma. Shown at 9 is magnetic field supplying means, which produces an external magnetic field perpendicular to the aforecited microwave electric field. The magnetic field gives rise to a microwave discharge jointly with the microwave electric field. In general, the magnetic field to be produced by the magnetic field supplying means is a mirror type magnetic field which contains the plasma effectively. Numeral 8 designates a gas supply conduit, from which a gas such as $N_2$, Ar and $O_2$ under $1 \times 10^{-3}$ to $10^{-5}$ Torr is introduced. The gas is ionized by the microwave discharge. Shown at 12 is a substrate to be etched, which is maintained at a predetermined potential by a power source 13 or is grounded. Owing to such a construction, an ion sheath is formed between the substrate 12 and the plasma generated by the microwave discharge in the magnetic field. The ions of the introduced gas pass through the ion sheath, and impinge on the substrate 12 to etch it.

However, when the coaxial waveguide is employed as in this construction, the inner conductor of the coaxial waveguide is held by the insulator and is therefore thermally isolated from the other parts, so that the inner conductor easily reaches a high temperature and is subject to thermal destruction at the connecting portion with the insulator. Moreover, in plasma etching apparatus the homogeneity of the plasma density distribution in the radial direction must be good. In the construction employing the coaxial waveguide, however, a part underneath the inner conductor or the microwave - plasma coupling device and a part surrounding the part exhibit large difference in plasma density, so that uniform etching cannot be carried out.

SUMMARY OF THE INVENTION

An object of the invention is to provide an improved plasma etching apparatus.

Another object of the invention is to provide a plasma etching apparatus employing a microwave discharge which has solved the problems of the prior art stated above.

These and other objects are accomplished by a plasma etching apparatus having a microwave generator, a waveguide for propagating microwaves, a discharge area, coupling means to introduce the microwave power into the discharge area, magnetic field supplying means to supply an external magnetic field to the discharge area, and a gas supply conduit for introducing a discharge gas into the discharge area therefrom, whereby a substrate surface is processed by ions, radical atoms and radical molecules in a plasma generated in the discharge area, the plasma etching apparatus comprising the improvement wherein a round waveguide is employed as the microwave coupling means, the discharge area being provided within the round waveguide.

DETAILED DESCRIPTION OF THE PREFERRED EMBODIMENTS

Figure 1:
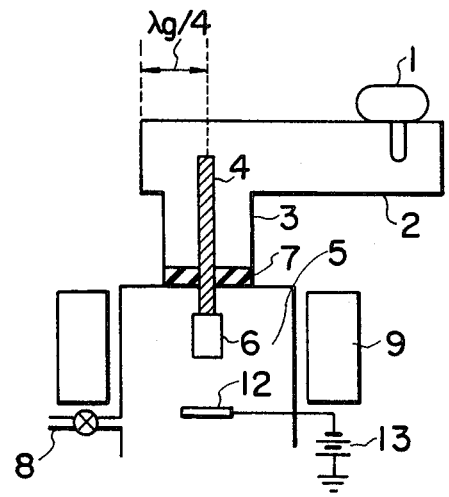
FIG. 1 is a diagrammatical sectional view of a prior-art etching apparatus.
Figure 2:
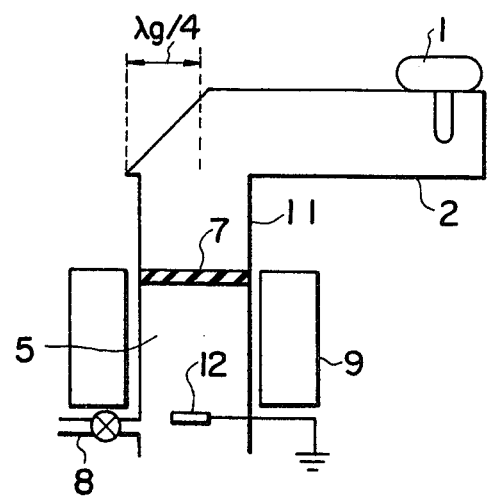
FIG. 2 is a diagrammatical sectional view of an embodiment of the etching apparatus according to the invention.

FIG. 2 is a view showing an embodiment of the invention. Microwaves generated by a microwave generator 1 are radiated into a rectangular waveguide 2. The microwaves are propagated into a round waveguide 11 which is so connected that its axis lies at a position of $\frac{1}{4}$ of the guide wavelength from the terminal end of the rectangular waveguide 2. In order to ensure a good propagation efficiency from the retangular waveguide 2 to the round waveguide 11, the end of the waveguide 2 is cut obliquely relative to the axis of the waveguide 11. The round waveguide 11 is divided into a first section connected to waveguide 2 and a second section forming a discharge area 5 by an insulator 7. Microwave power is propagated into the discharge area 5 through the insulator 7. Numeral 8 designates a gas supply conduit, numeral 9 magnetic field supplying means, and numeral 12 a substrate to be etched. The substrate 12 is grounded as shown in the figure, or it is maintained at a predetermined potential. As is apparent from the present embodiment, the invention employs the round waveguide as the microwave introducing or coupling means. Unlike the prior-art example, therefore, a thermally weak portion such as the inner conductor of the coaxial waveguide is not included. Owing to this fact, the apparatus is not destroyed even when high-power microwaves are introduced. Further, owing to the absence of the inner conductor, the concentration of electric fields does not occur, so that the homogeneity of the density distribution of a plasma in the radial direction is enhanced and that the uniformity of the etching of the substrate 12 is enhanced.

Figure 3:
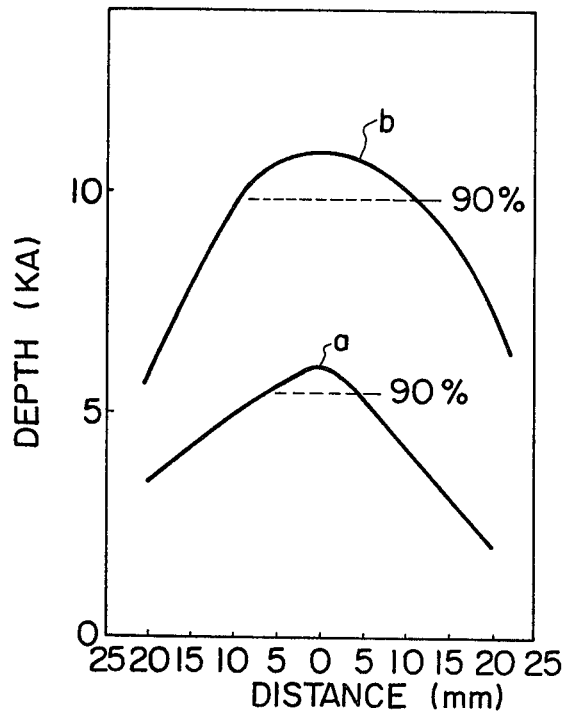
FIG. 3 is a graph for explaining effects of the etching apparatus according to the invention.

FIG. 3 illustrates an experimental result obtained by employing the plasma etching apparatus shown in FIG. 2. In FIG. 3, the abscissa represents the distance from the center of the substrate, while the ordinate represents the etched depth. Curve $a$ indicates, for comparison's sake, the performance of the prior-art apparatus employing the coaxial waveguide as the microwave coupling means, and curve $b$ indicates the performance of the apparatus of the invention employing the round waveguide. In the experiment, microwave power at 2.45 GHz and 200 Watts was introduced, the introduced gas was Ar under $5 \times 10^{-4}$ Torr, the substrate voltage was $-500$ V, the intensity of the magnetic field was 1600 Gauss, and the etching period was 1 minute. As is apparent from the Figure, the diameter at which the etched depth becomes 90% of the central value is approximately 20mm with the round waveguide, and approximately 10mm with the coaxial waveguide, so that the uniformity is enhanced by a factor of two or more. Although not shown in the drawing, when the coaxial waveguide was employed, the etched proportion was lower at the center of the substrate than at the surrounding part under some conditions. On the average, the uniformity of the etching in the invention was enhanced by a factor of approximately two over the prior art.

Figure 4:
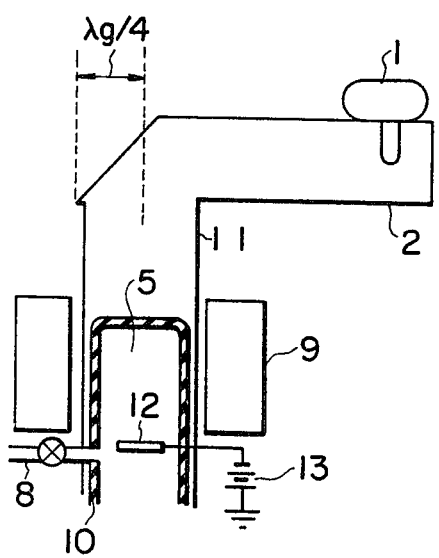
FIGS. 4 and 5 are diagrammatical sectional views of further embodiments of the etching apparatus according to the invention.

FIG. 4 shows another embodiment of the invention. The propagation of microwaves up to the round waveguide is the same as in the embodiment of FIG. 2. A discharge tube 10 made of an insulator such as quartz glass is disposed within the round waveguide, and is filled with a discharge gas (Ar, $O_2$, $N_2$, etc. are selected according to the purpose of use) so as to produce a plasma. The function of the insulator tube 10 is to prevent the contamination of the substrate 12 by impurities. That is, the plasma produced by the microwave discharge is prevented from sputtering the inner wall of the round waveguide 11, and substances such as the metal constituting the inner wall are prevented from mingling into the substrate. This combination of round waveguide and insulator tube is more effective than the combination of the coaxial waveguide and the insulator tube. In the latter case, when the introduced discharge gas is a gas such as $CF_4$ gas, which is liable to produce a chemically-active gas when decomposed, the insulator tube around the inner conductor heated to a high temperature and the chemically-active gas component produce local reactions, and the insulator tube is destroyed. In actuality, therefore, etching with $CF_4$ or the like would be impossible. On the other hand, in the case of the present embodiment, even when $CF_4$ or the like is employed, the insulator tube is not destroyed because no part is locally heated. Accordingly, reactive gas etching employing a chemically-active gas such as $CF_4$, $CCl_4$, and $BCl_3$ is also possible.

Figure 5:
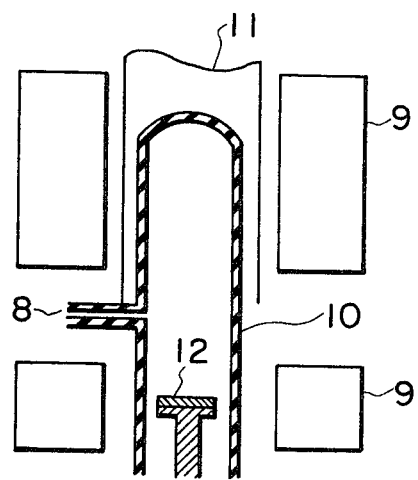

FIG. 5 shows still another embodiment of the invention. A cylinder 10 which is made of quartz glass containing very few impurities and which easily propagates microwaves is placed in the round waveguide 11 so that the microwaves may be propagated in a vacuum. A magnetic field, preferably a mirror type static magnetic field, is superposed in a direction orthogonal to the high-frequency electric field by the magnetic field coil 9, so that electrons in the vacuum acquire energy from the microwave electric field and conduct a spiral motion. The electrons collide with gaseous molecules introduced from the gas supply conduit 8 and are ionized. Thus, a plasma is produced. According to the present embodiment, where a magnetic field of 1600 Gauss was applied with microwaves of 2.45 GHz, a plasma having an electron temperature of about 6 eV and an electron density of about $10^{11}/cm^3$ was obtained with argon gas under $10^{-4}$ Torr. Even when $CF_4$ gas was used as the active gas, a plasma at substantially the same degree was obtained. When the potential of the plasma is zero, an object inserted in the plasma assumes a floating potential. The floating potential $V_f$ is given approximately by:

$$V_f = (kT_e/e) \ln \sqrt{m/M}$$

where
$k$: Boltzmann's constant,
$T_e$: plasma electron temperature,
$e$: electron charge,
$m$: mass of electron, and
$M$: ionic mass.

Here, the electron temperature of the plasma is about 6 eV by actual measurement. Therefore, supposing $F^+$ ions are the gas ions, the floating potential becomes:

$$V_f \doteq -22V$$

That is, even when the substrate in the plasma is not intentionally given an applied voltage, it acquires a potential of about $-20$ V, and the ions are accelerated to about 20 eV and impinge onto the substrate. The current density is one to two orders or more higher than in the case of the prior art, and the processing speed does not decrease. According to the present embodiment, where a silicon single crystal was etched with the $CF_4$ gas without applying any voltage to the substrate, it could be processed in about 0.1 $\mu$m per minute, and where a negative potential of 500 V was applied to the substrate with respect to the plasma potential, the substrate could be processed at about 1 $\mu$m per minute. In these cases, the etching rate of photoresist employed for a mask exhibited a value one order or more less than that of silicon, and the processed profile was better than by the conventional RF (radio frequency) plasma etching. The contamination of the substrate attributed to impurities was the same as in the case of the plasma etching apparatus having its periphery covered with quartz glass.

In this manner, there are obtained the benefits when a gas plasma highly reactive to the material to be processed is generated in the magnetic field and electric field and that the discharge area is provided in the container which employs the insulator for the peripheral wall so as to prevent the impurities from mingling due to the collision of the plasma, the substrate to-be-processed being located in the discharge area.

While the invention has been described above with reference to the arrangements illustrated in the drawings, the waveguide for propagating microwaves to the round waveguide need not be rectangular, but a waveguide of a different type, for example, a coaxial waveguide or a round waveguide may be employed.

The coupling between the waveguide for propagating microwaves and the round waveguide need not be orthogonal to each other as illustrated in the drawings, but any shape for the coupling may be adopted insofar as the microwaves are propagated.

Furthermore, since the insulator tube or cylinder needs only propagate the microwaves and hold a vacuum, the material is not restricted to quartz glass, but aluminous procelain etc, can also be used.

Furthermore, the outer wall of the discharge area 5 in the apparatus shown in FIG. 2 may be coated with any of the insulators mentioned above, and such apparatus achieves similar effects.

When etching a substrate with an introduced gas such as Ar, a predetermined potential must be applied to the substrate, but when performing chemical etching with a chemically-active gas such as $CF_4$, the substrate may be maintained at the floating potential.

As the active gas, $C_2F_6$, $C_3F_8$, $CCl_4$, $CF_2Cl_2$, or $BCl_3$ may be used in addition to $CF_4$.

The apparatus of the present invention described above in detail is free from thermal or electrical destruction and has a good homogeneity of etching as a plasma etching apparatus employing the microwave discharge, and it is very effective in industry for surface processing and surface treatment of semiconductors, etc.

While we have shown and described several embodiments in accordance with the present invention, it is understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

We claim:

1. In a plasma etching apparatus comprising:
   microwave generator means;
   waveguide means coupled to said generator for propagating microwaves therefrom;
   a discharge area;
   coupling means for introducing the microwave power from said waveguide into said discharge area;
   magnetic field supplying means for applying an external magnetic field to said discharge area; and
   gas supply conduit means to introduce a discharge gas into said discharge area;
   whereby the surface of a substrate disposed in said discharge area is processed by ions, radical atoms and radical molecules in a plasma produced within said discharge area;
   the improvement wherein said coupling means comprises a round waveguide means to introduce the microwave power and wherein said discharge area is provided within said round waveguide.

2. The improved plasma etching apparatus according to claim 1, wherein said round waveguide means further comprises insulator means for dividing said round waveguide means into a first section connected to said waveguide means and a second section forming said discharge area.

3. The improved plasma etching apparatus according to claim 1, wherein a container made of insulator material is disposed in said round waveguide means, and said discharge area is provided within said container made of insulator material.

4. The improved plasma etching apparatus according to claim 3, wherein said container is made of a material selected from the group consisting of quartz glass and aluminous porcelain.

5. The improved plasma etching apparatus according to claim 1, wherein said waveguide means for propagating microwaves is a rectangular waveguide means, and said round waveguide is so constructed that its axis lies at a position ¼ of a guide wavelength from an end of said rectangular waveguide.

6. In an apparatus for generating a microwave discharge comprising:
   a discharge area;
   means for introducing a discharge gas into said discharge area;
   means for introducing a microwave electric field into said discharge area; and
   means for applying a magnetic field to said discharge area, wherein a plasma is produced for etching the surface of a substrate located in said discharge area, said microwave electric field introducing means including substantially round waveguide means with said discharge area formed therewithin.

7. An apparatus as defined in claim 6, wherein said microwave electric field introducing means further comprises container means made of insulator material disposed in said round waveguide means and wherein said discharge area is provided therewithin.

* * * * *